United States Patent [19]
Kim

[11] Patent Number: 5,953,270
[45] Date of Patent: Sep. 14, 1999

[54] COLUMN REDUNDANCY CIRCUIT FOR A MEMORY DEVICE

[75] Inventor: Sung-Hoon Kim, Cheongju, Rep. of Korea

[73] Assignee: LG Semicon Co., Ltd., Cheongju, Rep. of Korea

[21] Appl. No.: 09/153,343

[22] Filed: Sep. 15, 1998

[30] Foreign Application Priority Data

Jun. 24, 1998 [KR] Rep. of Korea ...................... 98-23807

[51] Int. Cl.[6] ..................................................... G11C 7/00
[52] U.S. Cl. ................ 365/200; 365/230.06; 365/230.02
[58] Field of Search ............................... 365/200, 230.06, 365/230.03, 230.02, 230.08

[56] References Cited

U.S. PATENT DOCUMENTS

| | | | |
|---|---|---|---|
| 5,475,640 | 12/1995 | Kersh, III et al. | 365/200 |
| 5,495,445 | 2/1996 | Proebsting | 365/200 |
| 5,570,318 | 10/1996 | Ogawa | 365/200 |
| 5,621,691 | 4/1997 | Park | 365/200 |
| 5,652,725 | 7/1997 | Suma et al. | 365/200 |
| 5,835,424 | 11/1998 | Kikukawa et al. | 365/200 |

*Primary Examiner*—Son Mai
*Attorney, Agent, or Firm*—Fleshner & Kim

[57] ABSTRACT

The present invention relates to a column redundancy circuit in semiconductor memories which improves yields by means of substituting defective cells with redundant memory cells provided that defective memory cells are detected. The present invention of a redundancy circuit in semiconductor memories having a first memory cell array and a second memory cell arrays with an Y-decoder includes a first row redundancy circuit receiving a row address signal wherein the first row redundancy circuit outputs a first MAT selection signal for repairing a word line in the first memory cell array, a second row redundancy circuit receiving the row address signal wherein the second row to redundancy circuit outputs a second MAT selection signal for repairing a word line in the second memory cell array, a redundancy circuit controller generating a first MAT selection enable signal and a second MAT selection enable signal wherein the first MAT selection enable signal and the second MAT selection enable signal are complementary each other, a MAT selection signal controller receiving the first MAT selection signal and the second MAT selection signal wherein the MAT selection signal controller outputs one of the first MAT selection signal and the second MAT selection signal in accordance with the first MAT selection enable signal and the second MAT selection enable signal, respectively, a column redundancy circuit receiving a column address signal and the MAT selection signal which is outputted from the MAT selection signal controller wherein the column redundancy circuit outputs a repairing decision signal, a first MAT redundant signal and a second MAT redundant signal, and an Y-decoder receiving the first MAT redundant signal and the second MAT redundant signal wherein the Y-decoder outputs a normal column selection signal or a redundant column selection signal under a condition of the repairing decision signal.

10 Claims, 7 Drawing Sheets

COLUMN REDUNDANCY CIRCUIT FOR A MEMORY DEVICE

BACKGROUND OF THE INVENTION

1. Field of the Invention

The present invention relates to a column redundancy circuit in a semiconductor memory which improve yields by means of substituting defective cells with redundant memory cells provided that defective memory cells are detected.

2. Background of the Related Art

As the semiconductor technology develops abruptly to increase a density of integrated circuits, so does the storage capacity of semiconductor memories. That means that large number of memory cells can be integrated to a memory chip. The chip is rejected once a single defective cell is found out of the memory cells, thereby having a low yield and poorness in effectiveness.

Therefore, a method of increasing yields is widely used by means of replacing defective cells by redundant cells which are ready to be substituted. This method is essentially accompanied by the problems such as the increased chip size due to the redundant components and additional tests for repairing the defective cells, which is hardly welcomed in ordinary logic circuits. Yet, the method of repairing defective cells prevails in the various fields of memory devices over 64 Kb DRAM's because the occupied area of redundant memory cells is relatively smaller than that of normal memory cell arrays.

FIG. 1 shows block diagram of a X-decoder, a Y-decoder and memory cell arrays of 64 Kb unit MATs.

Referring to FIG. 1, the memory cell array 101 is composed of 256(32×8) unit MATs, and each unit MAT has a storage capacity of 64 Kb.

A Y-decoder 103 generates a plurality of Y-selection signals by means of decoding a column address. A Y-selection signal from the Y-decoder is inputted to two memory cell arrays 101 and 102 to select a bit line designated by a decoded column address, respectively. That is, two bit lines are simultaneously selected by a decoded column address at both memory cell arrays 101 and 102.

X-decoders 104 and 105 drive a designated word line by means of decoding a row address as a row decoder. The memory cell arrays 101 and 102 are equipped with X-decoders 104 and 105 which select word lines, respectively. The X-decoders 104 and 105 are inputted with an identical row address and then select word lines from the memory cell arrays, respectively.

FIG. 2 shows memory cell arrays in FIG. 1 which are partially magnified wherein sixteen unit MATs MAT00 to MAT33 are included in the memory cell arrays.

Referring to FIG. 2, two redundant Y-selection signal lines RYS0 and RYS1 and two redundant word lines RWL0 and RWL1 show how they are connected to each unit MAT. A redundant Y-selection signal line RYSx is connected to every two MAT rows, while a redundant word line RWLx is connected to every two MAT columns.

Each unit MAT MAT00 to MAT33 has 256 normal word lines and 256 Y-selection signal lines, yet not shown in the drawing. A plurality of bit lines are selected by a single Y-selection signal line and, simultaneously, data of a plurality of bits are outputted by a single column address, if the semiconductor memory shown in FIG. 1 and FIG. 2 is a synchronous DRAM. This is so-called a burst mode which decides the number of bits of data signals outputted simultaneously by a column address.

FIG. 3 show a block diagram of a column redundancy circuit in semiconductor memories according to a related art.

Referring to FIG. 3, a row address signal of external address signals in a TTL level is transformed into CMOS level in a row address buffer 213 and then inputted to a row redundancy circuit 214 in which the information of the row address of a defective normal memory cell is stored.

The row redundancy circuit 214 produces a row address of a redundant memory cell in order to replace a defective memory cell with the redundant memory cell when the row address of the defective memory cell is inputted row redundant circuit 214. This means that a word line of the defective memory cell is repaired. The address generated during the repairing process of a defective word line includes a MAT selection signal for designating an unit MAT having a defective memory cell, as well as the address for designating the memory cell.

A MAT selection signal α outputted from the row redundancy circuit 214 is inputted to a column redundancy circuit 215. A column address out of external addresses in TTL level is transformed into CMOS level by an address buffer 211 and then inputted to a counter 212 which counts the burst length. The column address from the counter 212 is inputted to a column redundancy circuit 215 and an Y-predecoder 216.

In this case, the MAT selection signal α and the column address are inputted to the column redundancy circuit 215. The MAT selection signal α is the signal for repairing a defect cell on a row. Thus, the repairing process is carried out for the word line of the memory cell of which row has been repaired.

The column redundancy circuit 215 activates a column redundant signal β in order to repair a defective column once a repairing process is required by means of analyzing the MAT selection signal α and the column address. The Y-predecoder 216 outputs a signal to an Y-decoder by means of pre-decoding the present inputted column address once the column redundant signal β is activated. Then, instead of a normal Y-selection signal NYSx, the Y-decoder 217 outputs a redundant Y-selection signal RYSx which is activated by an activated column redundant enable signal τ.

However, when the columns of the two memory cell arrays 101 and 102 as shown in FIG. 1 are to be repaired by the column redundancy circuit, it is hard to repair one of the memory cell arrays 101 and 102 independently because two unit MATs are selected by a single MAT selection signal α which has been outputted from the row redundancy circuit 214.

Once defectiveness of a memory cell array, the column redundancy circuit repairs a defective memory cell as well as a normal memory cell designated by an identical address. Accordingly, the column redundancy circuit repairing the columns of the selected two MATs has low efficiency in repairing the defective memory cells.

The efficiency in repairing the defective memory cells may be increased provided that each of the memory cell arrays is repaired independently by using an additional Y-decoder. Yet, another problem of the layout size of a chip is caused due to the division of the Y-decoder.

The above references are incorporated by reference herein where appropriate for appropriate teachings of additional or alternative details, features and/or technical background.

SUMMARY OF THE INVENTION

Accordingly, the present invention is directed to a column redundancy circuit in semiconductor memories that substantially obviates one or more of the problems due to limitations and disadvantages of the related art.

The object of the present invention is to provide a column redundancy circuit selectively repairing a defective one of two memory cell arrays communicating with a single Y-decoder.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a redundancy circuit includes a first row redundancy circuit; a second row redundancy circuit; a redundancy circuit controller; a MAT selection signal controller; a column redundancy circuit; and an Y-decoder. The first row redundancy circuit receives a row address signal and outputs a first MAT selection signal to repair a word line in a first memory cell array.

The second row redundancy circuit receives the row address signal and outputs a second MAT selection signal to repair a word line in a second memory cell array.

The redundancy circuit controller generates a first and second MAT selection enable signal. The first and second MAT selection enable signals are complementary each other.

The MAT selection signal controller receives the first and second MAT selection signals and outputs either the first or the second MAT selection signal in accordance with the first or second MAT selection enable signal.

The column redundancy circuit receives a column address signal and the MAT selection signal from said MAT selection signal controller, and outputs a repairing decision signal, a first MAT redundant signal and a second MAT redundant signal.

The Y-decoder receives the first and second MAT redundant signals, outputs either a normal column selection signal or a redundant column selection signal according to the repairing decision signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

Figure 1:
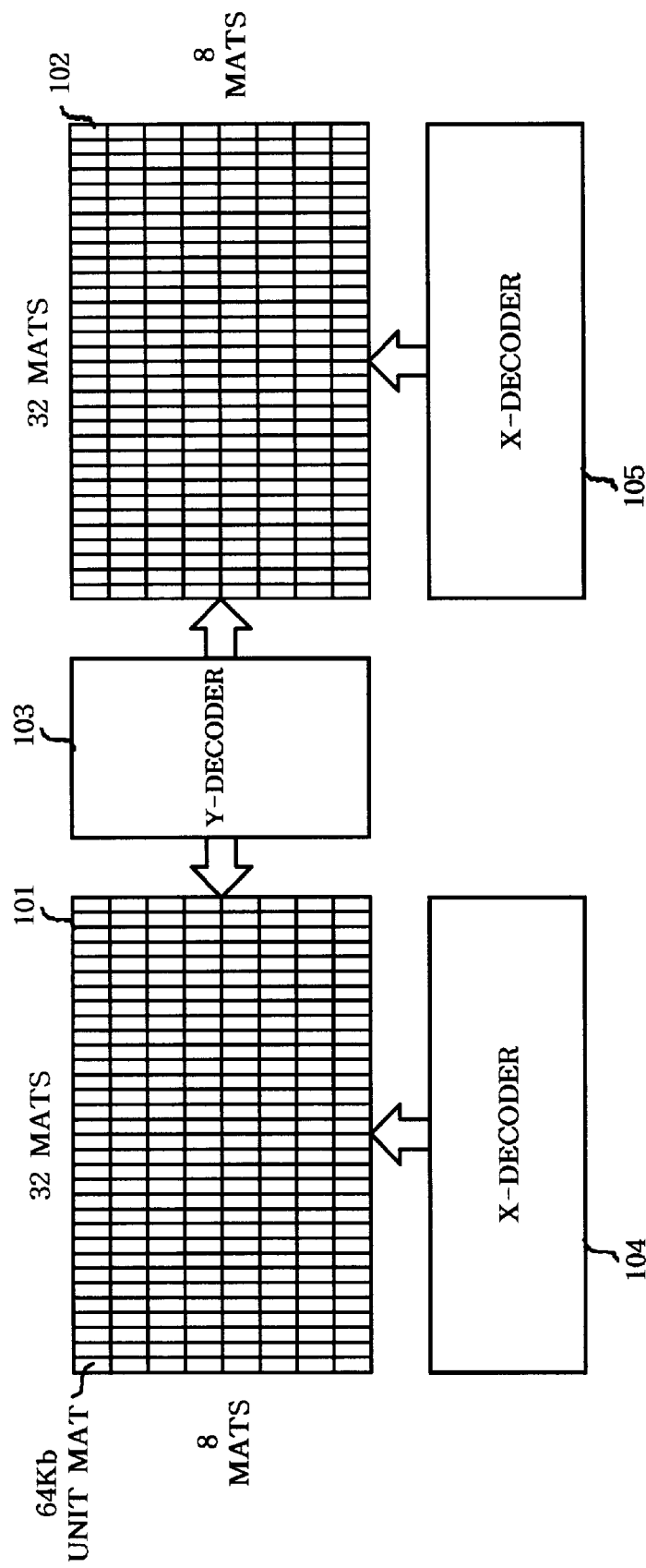
FIG. 1 is a block diagram which shows connections between an Y-decoder, X-decoders and semiconductor memory cell arrays according to a related art.
Figure 2:
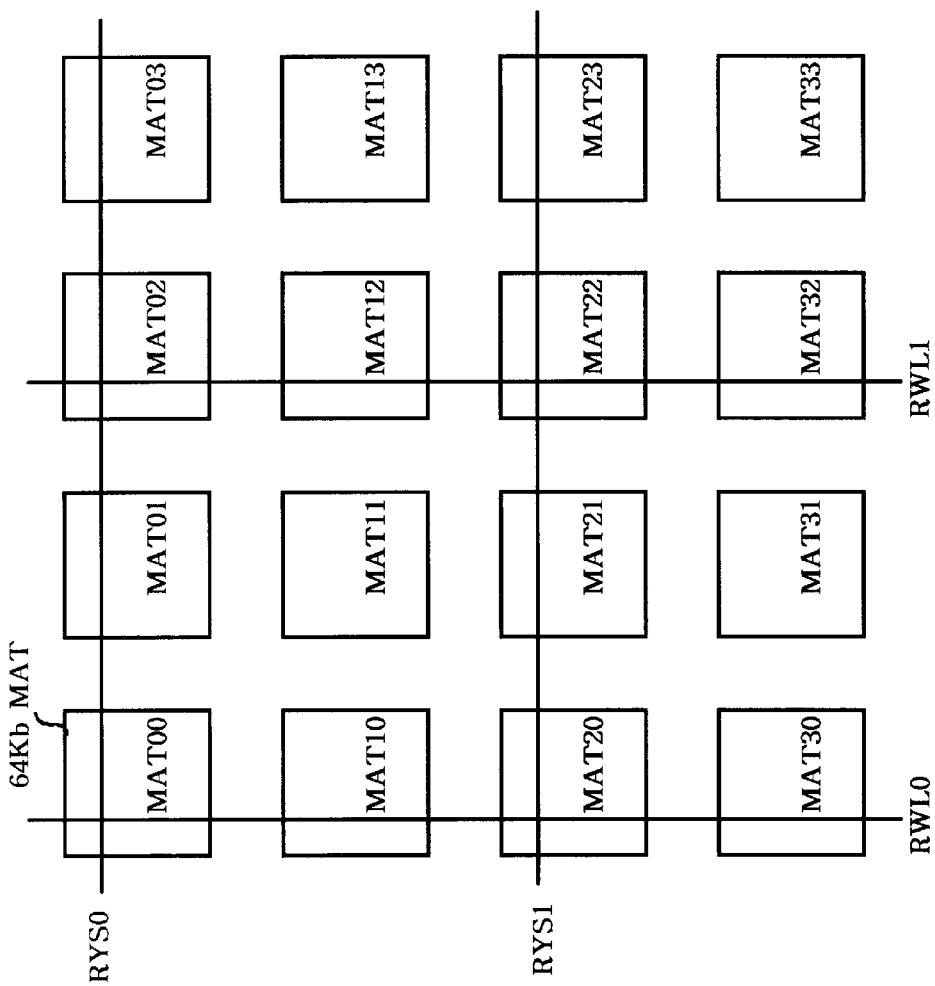
FIG. 2 shows a portion of a semiconductor memory cell array of FIG. 1 in detail.
Figure 3:
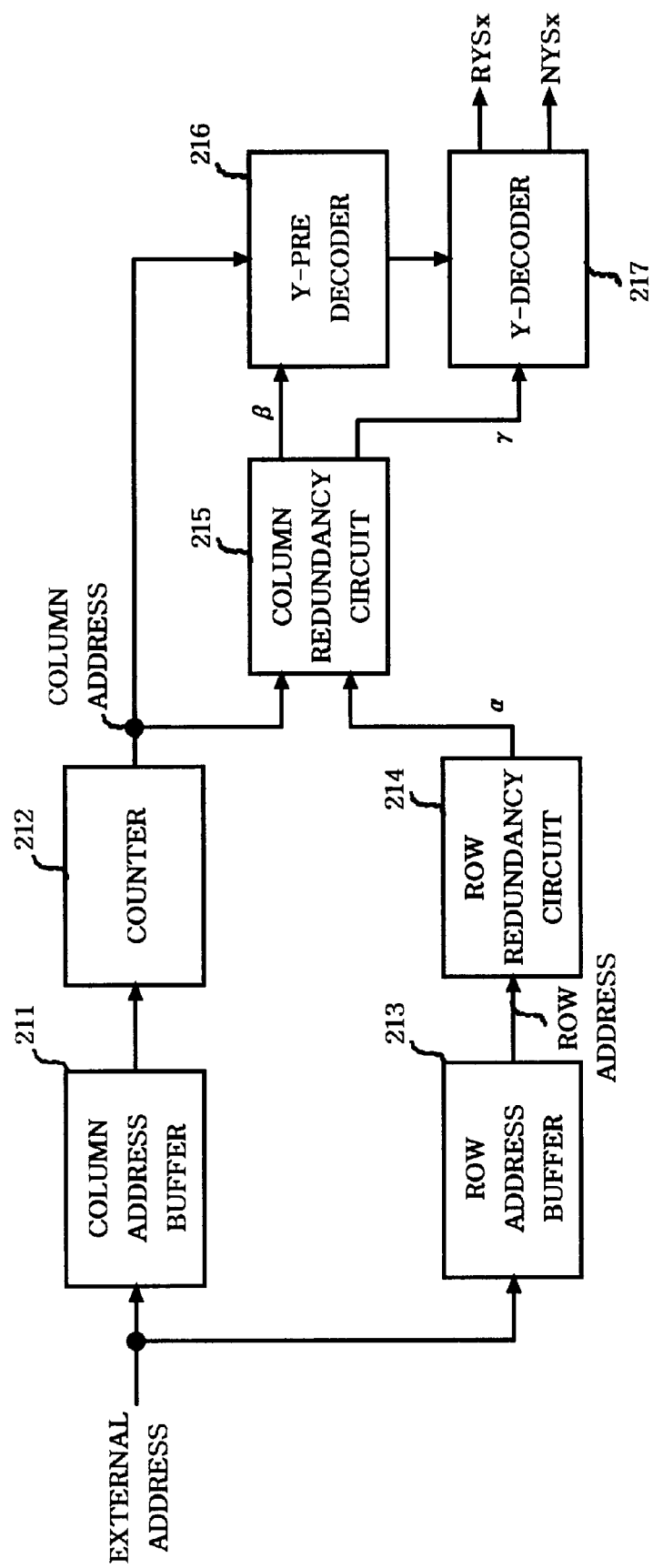
FIG. 3 shows a block diagram of a column redundancy circuit in semiconductor memories of FIG. 1 and FIG. 2.
Figure 4:
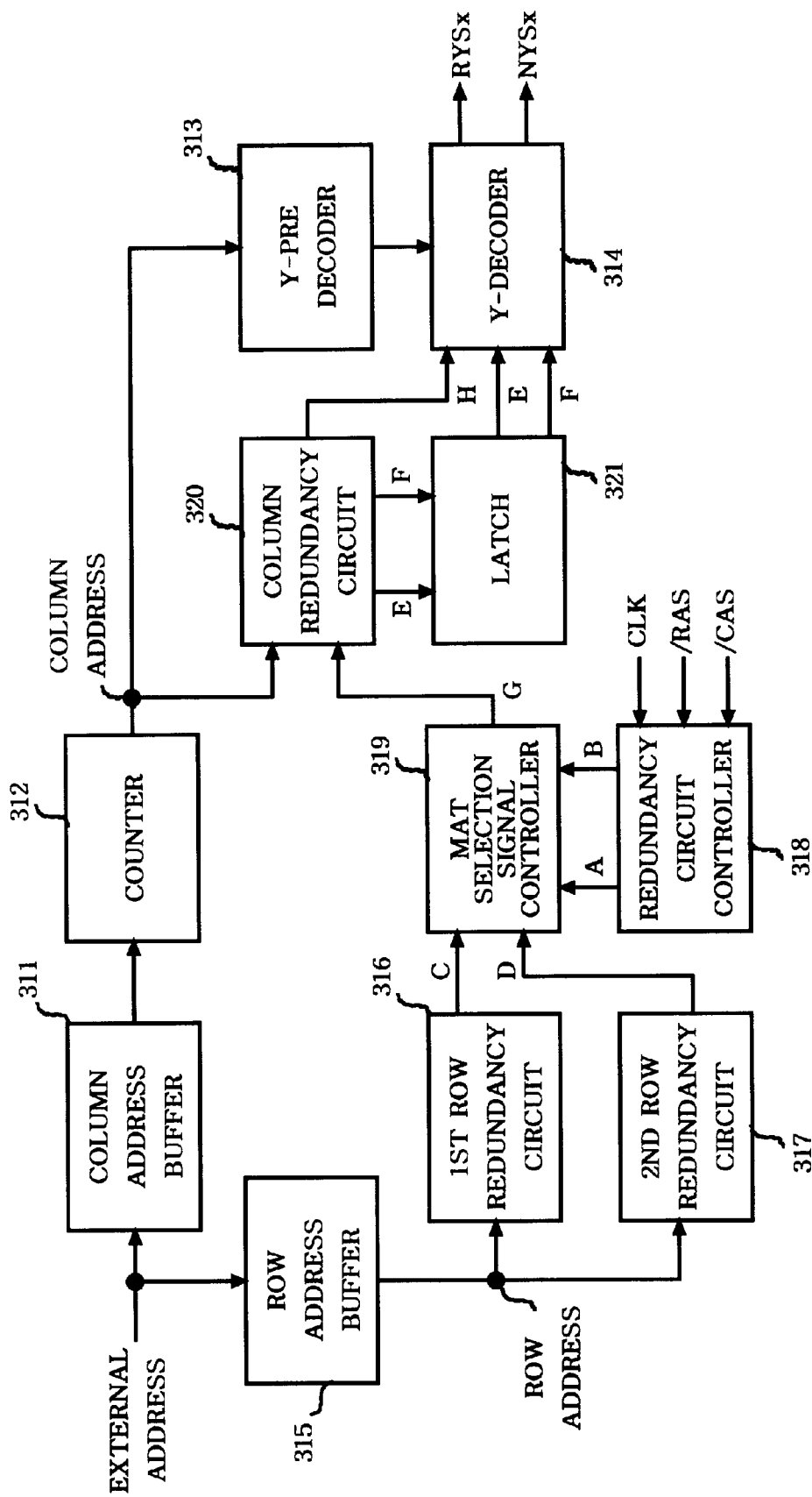
FIG. 4 shows a block diagram of a column redundancy circuit according to the present invention.

FIG. 4 shows a block diagram of a column redundancy circuit according to the present invention.

Referring to FIG. 4, an external address in TTL level, which is inputted to both a column address buffer 311 and a row address buffer 315, is transformed into CMOS level by the column address buffer 311 and the row address buffer 315. The row address from the row address buffer 315 is inputted to a first redundancy circuit 316 and a second redundancy circuit 317, respectively.

If an Y-decoder lies between a first and a second memory cell array, the first redundancy circuit 316 stores a row address information of a defective memory cell in the first memory cell array and generates a first MAT selection signal C which designates a row of a MAT to be repaired in the first memory cell array. Then, the first MAT selection signal C is inputted to a MAT selection signal controller 319.

And, the second redundancy circuit 317 stores a row address information of a defective memory cell in the second memory cell array and generates a second MAT selection signal D which designates another row of a MAT to be repaired in the second memory cell array. Then, the second MAT selection signal D is inputted to a MAT selection signal controller 319 as well.

A redundancy circuit controller 318 generates a first MAT selection enable signal A and a second MAT selection enable signal B which are complementary each other by logical value of a clock signal CLK, a row address strobe bar signal /RAS and a column address strobe bar signal /CAS. The first MAT selection enable signal A and the second MAT selection enable signal B control the MAT selection signal controller 319 to select either the first MAT selection signal C or the second MAT selection signal D which is going to be outputted as a MAT selection signal G. Then, the MAT selection signal G is inputted to a column redundancy circuit 320.

A column address outputted from a column address buffer 311 becomes to have a predetermined burst length by a counter 312. The column address outputted from the counter 312 is inputted to an Y-predecoder 313 and the column redundancy circuit 320. The Y-predecoder 313 pre-decodes the column address and then outputs a pre-decoded column address to an Y-decoder 314.

Column redundancy circuit 320 stores the information of the column address of a defective memory cell in a memory cell arrays, and also generates a first or a second MAT redundant signal E or F in order to repair a memory cell designated by the MAT selection signal G and the column address. In this case, the MAT redundant signals E and F are determined by the fact whether the MAT selection signal G from the MAT selection signal controller 319 is the first MAT selection signal C or the second MAT selection signal D. The first or the second MAT redundant signal E or F which is outputted from the column redundancy circuit 320 is stored in a latch 321 and then transferred to the Y-decoder 314.

The column redundancy circuit 320 decides whether the memory, cell of the column address according to both values of the column address and the MAT selection signal G is inputted for the time being and then outputs a repairing decision signal H to the Y-decoder 314. The Y-decoder 314, once the repairing decision signal is generated, activates a redundant column selection signal RYSx instead of a normal column selection signal NYSx in order to repair the memory cell of the presently inputted column address in a MAT which has been designated by the first or the second MAT redundant signal E or F.

Figure 5:
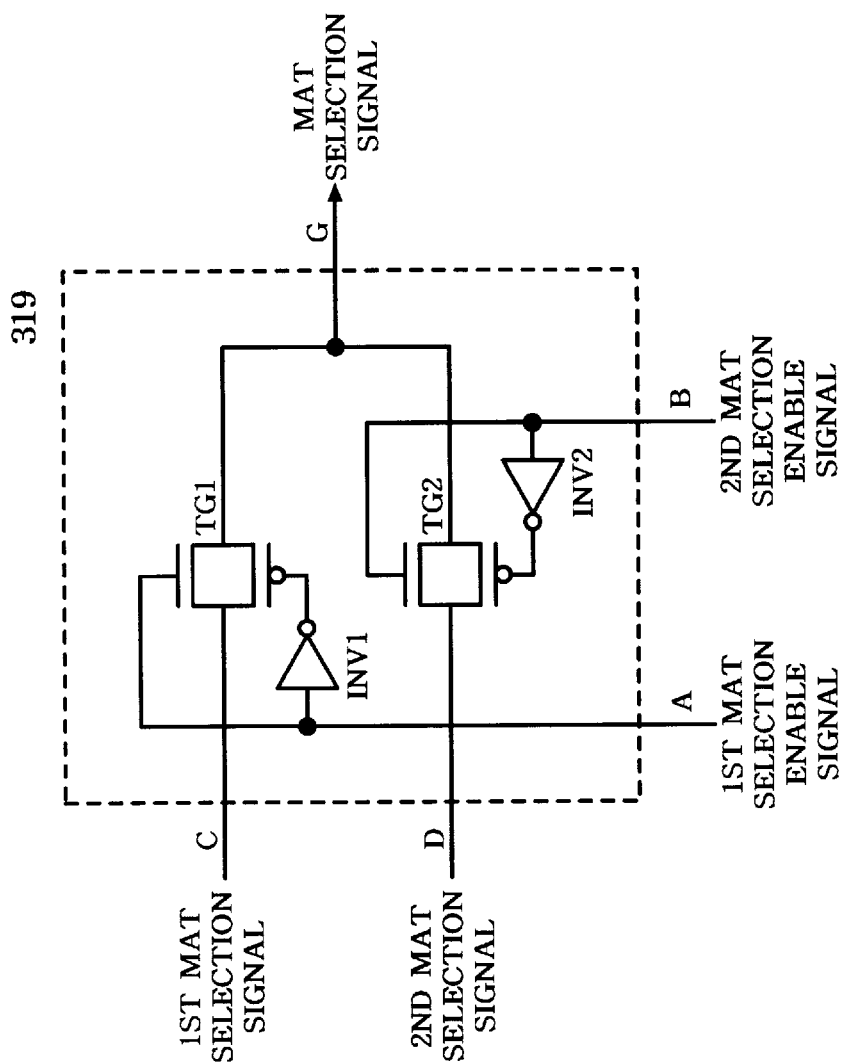
FIG. 5 shows a MAT selection signal controller in a column redundancy circuit according to the present invention.

FIG. 5 shows a MAT selection signal controller 319 in a column redundancy circuit according to the present invention.

Referring to FIG. 5, a MAT selection signal controller 319 includes a first transmission gate TG1 which is turned on by the first MAT selection enable signal A and then delivers the first MAT selection signal C and a second transmission gate TG2 which is turned on by the second MAT selection enable signal B and then outputs the second MAT selection signal D. Two inverters INV1 and INV2 invert the first and the second MAT selection signal A and B, respectively.

Figure 6:
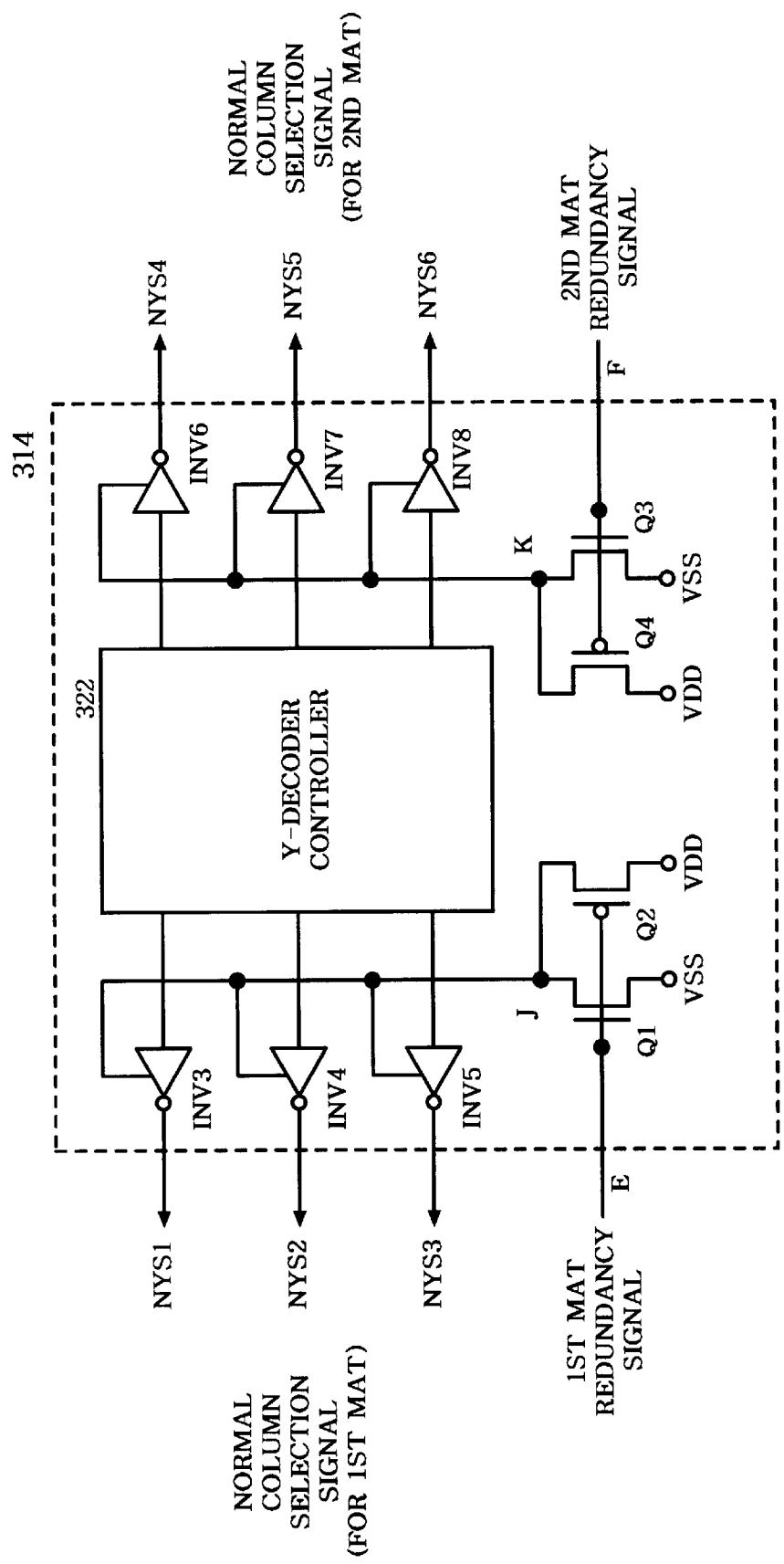
FIG. 6 shows a circuit of an Y-decoder according to the present invention.

FIG. 6 shows a circuit of an Y-decoder 314 according to the present invention.

Referring to FIG. 6, an Y-decoder controller 322 outputting normal column selection signals NYS1 to NYS6 for a first and a second MAT is the main part of the Y-decoder 314.

Outputs of the normal column selection signals NYS1 to NYS6 are controlled by tri-state inverters INV3 to INV8 of switching devices. The three tri-state inverters INV3 to INV5 controlling the outputs of the normal column selection signals NYS1 to NYS3 in a first MAT are switched by a first driver applying voltage J through an NMOS and it an PMOS transistor Q1 and Q2 which are connected each other in parallel.

The NMOS transistor Q1 and the PMOS transistor Q2 are switched in accordance with a logic level of the first MAT redundant signal E. Once the first MAT redundant signal E is high level, the NMOS transistor Q1 turned on and the first driver applying voltage J becomes a grounded voltage of low level. Thus, the tri-state inverters INV3 to INV5 turned off. On the other hand, once the first MAT redundant signal E is low level, the PMOS transistor Q2 turned on and the first driver applying voltage J becomes a power supply voltage VDD of high level. Thus, the tri-state inverters INV3 to INV5 turned on.

Other tri-state inverters INV6 to INV8 is switched in accordance with a second driver applying voltage K which is supplied through an NMOS transistor Q3 and a PMOS transistor Q4.

The NMOS transistor Q3 and the PMOS transistor Q4 are switched in accordance with a logic level of the second MAT redundant signal F. Once the second MAT redundant signal F is high level, the NMOS transistor Q3 becomes turned on and the second driver applied voltage K becomes a grounded voltage VSS of low level. Thus, the tri-state inverters INV6 to INV8 turned off. On the other hand, once the second MAT redundant signal F is low level, the PMOS transistor Q4 turned on and the second driver applying voltage K becomes a power supply voltage VDD of high level. Thus, the tri-state inverters INV6 to INV8 turned on.

Figure 7:
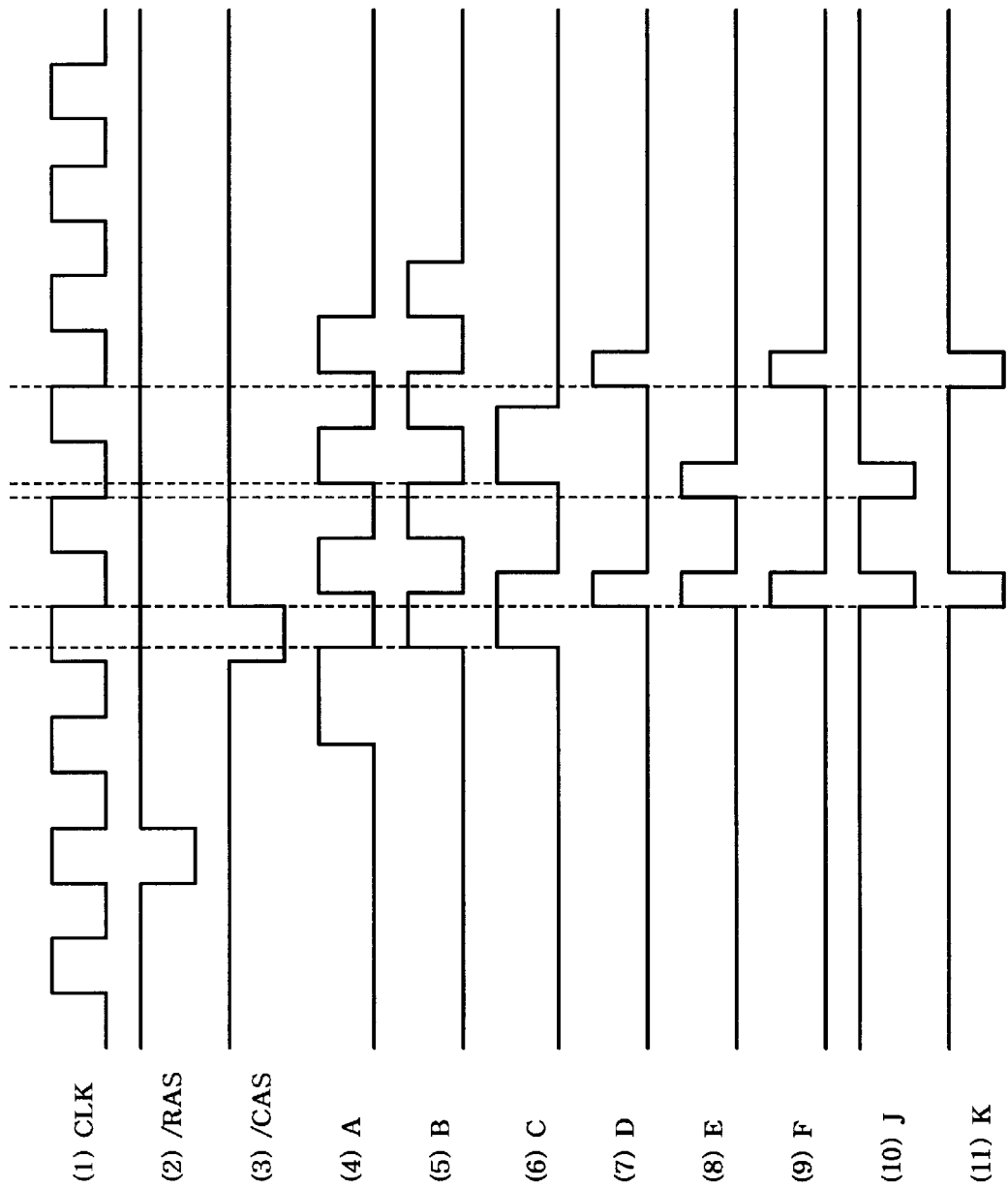
FIG. 7 shows timing diagrams of input/output signals of a column redundancy circuit according to the present invention.

FIG. 7 shows timing diagrams of input/output signals if a column redundancy circuit according to the present invention.

Referring to FIG. 7, (1) is a clock signal CLK, (2) is a row address strobe bar signal /RAS and (3) is a column address strobe bar signal /RAS. It is certain that the row address strobe bar signal /RAS is activated faster than the column address strobe bar signal /CAS.

Another timing diagrams (4) and (5) which are complementary each other are a first MAT selection enable signal A and a second MAT selection enable signal B, respectively. The first MAT selection enable signal A is activated to become high level at a first ascending corner of a clock signal CLK after the row address strobe bar signal /RAS has been activated. After the column address strobe bar signal /CAS has been activated, the first MAT selection enable signal A becomes low level at a first rising edge of a next clock signal CLK and then becomes a pulse signal which has both the same period and logic level as the clock signal CLK.

The second MAT selection enable signal B, after the column address strobe bar signal /CAS has been activated, is activated at a first rising edge of the clock signal CLK and then becomes another pulse signal which has both the same period and logic level as the clock signal CLK.

Another timing diagrams (6) and (7) are a first MAT selection signal C and a second MAT selection signal D, respectively. The first MAT selection signal C and the second MAT selection signal D decide logic levels of a first MAT redundant signal E and a second MAT redundant signal F, respectively. Namely, the first MAT selection signal C and the second MAT redundant signal E have the same logic level, and the second MAT selection signal D and the second MAT redundant signal F have the same logic level as well.

The first MAT redundant signal E and the second MAT redundant signal F decide the logic levels of the first driver applying voltage J in a timing diagram (10) and the second driver applying voltage K in a timing diagram (11), respectively. As mentioned in the operational explanation of FIG. 6, the first driver applying voltage J and the second driver applying voltage K have the inverted logic levels of the first MAT redundant signal E and the second MAT redundant signal F, respectively.

Referring FIGS. 6 and 7, the operation of repairing a column in accordance with the present invention will be explained in detail.

The first driver applying voltage J and the second driver applying voltage K becomes low level VSS once both the first MAT redundant signal E and the second MAT redundant signal F are high level. Therefore, the normal column selection signals NYS1 to NYS6 are not outputted since all of the tri-state inverters INV3 to INV8 are turned off. Instead, the first and the second MAT are repaired by activating the redundant column selection signal RYSx which is replaced by the column redundancy circuit.

Once the first MAT redundant signal E is high level and the second MAT redundant signal F is low level, only the first driver applying voltage J is low level VSS. Accordingly, the first MAT is repaired as the normal column selection signals NYS1 to NYS3 are not outputted.

Otherwise, once the first MAT redundant signal E is low level and the second MAT redundant signal F is high level, just the second driver applying voltage K becomes low level. Therefore, the second MAT is repaired since normal column selection signals NYS4 to NYS6 are not outputted therefrom.

When both the first MAT selection signal E and the second MAT selection signal F are high level, the first and the second MAT are not repaired as the first driver applying voltage J and the second driver applying voltage K become low level.

The column redundancy circuit according to the present invention has a great efficiency of column repair by selectively repairing only a defective one of two memory cell arrays communicating with a single Y-decoder.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A redundancy circuit in semiconductor memories, said semiconductor memories having a first memory cell array and a second memory cell array with an Y-decoder, said redundancy circuit comprising:

a first row redundancy circuit receiving a row address signal, said first row redundancy circuit outputting a first MAT selection signal for repairing a word line in said first memory cell array;

a second row redundancy circuit receiving said row address signal, said second row redundancy circuit outputting a second MAT selection signal for repairing a word line in said second memory cell array;

a redundancy circuit controller generating a first MAT selection enable signal and a second MAT selection enable signal, said first MAT selection enable signal and said second MAT selection enable signal being complementary each other;

a MAT selection signal controller receiving said first MAT selection signal and said second MAT selection signal, said MAT selection signal controller outputting one of said first MAT selection signal and said second MAT selection signal in accordance with said first MAT selection enable signal and said second MAT selection enable signal, respectively;

a column redundancy circuit receiving a column address signal and said MAT selection signal which is outputted from said MAT selection signal controller, said column redundancy circuit outputting a repairing decision signal, a first MAT redundant signal and a second MAT redundant signal; and an Y-decoder receiving said first MAT redundant signal and said second MAT redundant signal, said Y-decoder outputting a normal column selection signal or a redundant column selection signal under a condition of said repairing decision signal.

2. The redundancy circuit in semiconductor memories according to claim 1, said MAT selection signal controller further comprising:

a first transmission gate being turned on by said first MAT selection enable signal, said first transmission gate transferring said first MAT selection signal; and a second transmission gate being turned on by said second MAT selection enable signal, said second transmission gate transferring said second MAT selection signal.

3. The redundancy circuit in semiconductor memories according to claim 1, wherein said MAT selection signal controller outputs said first MAT selection signal when said first MAT selection enable signal is high level and outputs said second MAT selection signal when said second MAT selection enable signal is high level.

4. The redundancy circuit in semiconductor memories according to claim 1, said Y-decoder further comprising:

an Y-decoder controller outputting first and second normal column selection signal;

a first switching means receiving said first MAT redundant signal, said first switching means outputting a first control signal;

a second switching means receiving said second MAT redundant signal, said second switching means outputting a second control signal;

a first logic unit being enabled by said first control signal, said first logic unit receiving said first normal column selection signal, said first logic unit inverting and outputting said first normal column selection signal; and a second logic unit being enabled by said second control signal, said second logic unit receiving said second normal column selection signal, said second arithmetic and logic operator inverting and outputting said second normal column selection signal.

5. The redundancy circuit in semiconductor memories according to claim 4, wherein said first logic unit being enabled when said first MAT redundant signal is low level and said second logic unit being enabled when said second MAT redundant signal is low level.

6. The redundancy circuit in semiconductor memories according to claim 4, wherein said first switching means outputs said first control signal of low level when said first MAT redundant signal is high level and outputs said first control signal of high level when said first MAT redundant signal is low level.

7. The redundancy circuit in semiconductor memories according to claim 4, wherein said second switching means outputs said second control signal of low level when said second MAT redundant signal is high level and outputs said second control signal of high level when said second MAT redundant signal is low level.

8. The redundancy circuit in semiconductor memories according to claim 4, wherein said first logic unit includes a plurality of tri-state inverters which are enabled by said first control signal.

9. The redundancy circuit in semiconductor memories according to claim 4, wherein said second logic unit includes a plurality of tri-state inverters which are enabled by said second control signal.

10. The redundancy circuit in semiconductor memories according to claim 1, further comprising a latch which stores said first and said second MAT redundant signal and outputs to said Y-decoder.

* * * * *